United States Patent [19]

Pugh

[11] Patent Number: 4,584,537
[45] Date of Patent: Apr. 22, 1986

[54] SYNCHRONIZED OSCILLATOR LOCK DETECTOR

[75] Inventor: Michael W. Pugh, Oceanside, Calif.

[73] Assignee: Burroughs Corporation, Detroit, Mich.

[21] Appl. No.: 724,248

[22] Filed: Apr. 17, 1985

[51] Int. Cl.$^4$ .............................................. H03L 7/06
[52] U.S. Cl. .................................... 331/1 A; 331/25; 331/DIG. 2
[58] Field of Search .................. 331/1 A, 25, DIG. 2, 331/172, 173; 375/120; 307/262

[56] References Cited

U.S. PATENT DOCUMENTS 3,982,190 9/1976 Schaefer .................... 331/DIG. 2 X
4,473,805 9/1984 Guhn .................................... 331/1 A Primary Examiner—Eugene R. LaRoche
Assistant Examiner—D. C. Mis
Attorney, Agent, or Firm—Charles J. Fassbender; Kevin R. Peterson

[57] ABSTRACT

An all digital circuit which operates with an electronic oscillator of the type that receives an input signal and synchronizes its oscillations to transitions in the input signal, comprises: a pulse-generating circuit 20 coupled to the oscillator for digitally forming periodic pulses in synchronization with selected oscillations of the oscillator; a detecting circuit 30 coupled to receive the pulses and the input signal for digitally detecting whether a transition occurs in the input signal in the absence of a pulse; and a counting circuit 40 coupled to the detecting circuit for digitally counting so long as the detecting circuit fails to detect a transition in the absence of a pulse and for indicating the oscillator is synchronized when the count reaches a predetermined number.

9 Claims, 4 Drawing Figures

SYNCHRONIZED OSCILLATOR LOCK DETECTOR

BACKGROUND OF THE INVENTION

This invention relates to phase-locked oscillators; and in particular, it relates to circuits which operate in conjunction with such oscillators to determine when the oscillator is locked.

As is well known in the prior art and as is shown in FIG. 1, a phase-locked oscillator includes a phase error corrector circuit 11 and a voltage controlled oscillator circuit (VCO) 12. Circuit 11 has a pair of input terminals, one of which recieves an input signal IN and the other of which receives an output signal OUT from the VCO 12. In operation, circuit 11 sends a control voltage to the VCO 12 with a magnitude that is proportional to the phase difference between the IN and OUT signals. VCO 12 then responds to that control voltage by adjusting the frequency of the OUT signal such that the phase error is reduced.

Also shown in FIG. 1 is a common prior art circuit which detects when the IN and OUT signals are locked. That circuit includes a 90° phase shifter 13, a multiplier 14, a filter 15, and a comparator 16. Additional details of this circuit are described in the textbook *Phaselock Techniques* by Gardner, 2nd edition, at page 88.

One problem, however, with the above referenced circuit of Gardner is that it is not suitable for integration on a digital logic array chip. This is because the shifter 13 and filter 15 are analog components which are not available in digital logic array chips.

Also, the above referenced Gardner circuit requires a reference voltage $V_R$ which is not available on digital logic array chips. Further, the analog voltage from the filter 15 which is compared against the reference voltage $V_R$ to determine whether or not the oscillator is locked, is sensitive to DC offsets and drift in the reference voltage; and it is also sensitive to offsets and drift in other DC bias voltages in the circuits 13–16.

In addition, the makeup of the 90° phase shifter 13 in the Gardner circuit is frequency dependent. One set of components is needed to shift a 50 MHz OUT signal by 90°, and a different set of components is needed to shift a 100 MHz OUT signal by 90°. Thus, over a wide range of OUT frequencies, a single Gardner circuit cannot be used.

Accordingly, a primary object of the invention is to provide a novel circuit which determines when an oscillator is locked and also avoids all of the above described prior art problems.

BRIEF SUMMARY OF THE INVENTION

According to the present invention, the above object and others are achieved by an all digital circuit which operates with a phase-locked oscillator comprising:

a pulse-generating circuit coupled to the oscillator for digitally generating periodic pulses in synchronization with selected oscillations of the oscillator;

a detecting circuit coupled to the pulse-generating circuit for digitally detecting when a transition occurs in the input signal in the absence of a pulse; and a counting circuit coupled to both of the above recited circuits for digitally counting so long as the detecting circuit fails to detect a transition in the absence of a pulse and for indicating the oscillator is locked in sync when the count reaches a predetermined number.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 2:
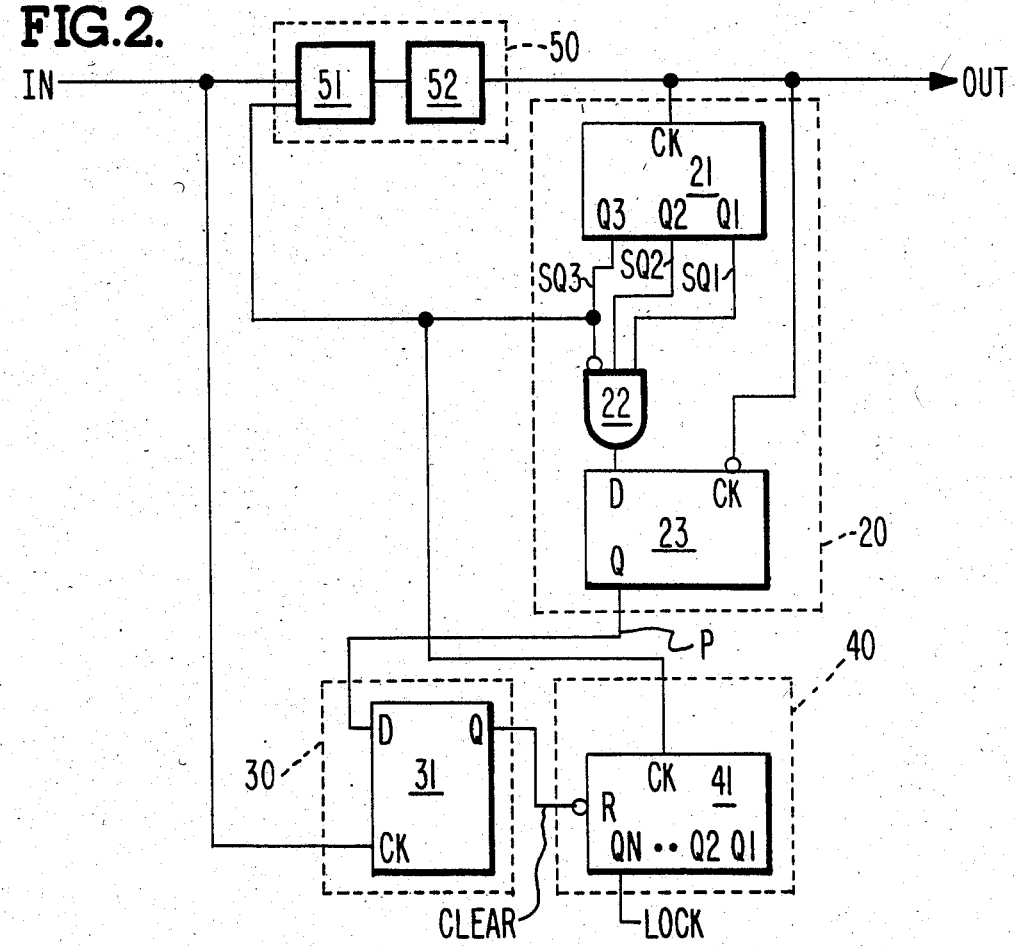
FIG. 2 is a circuit diagram of a preferred embodiment of the invention.

Referring now to FIG. 2, a preferred embodiment of the invention will be described in detail. This embodiment includes a pulse-generating circuit 20, a detector circuit 30, a counting circuit 40, and an oscillator 50. These circuits 20, 30, 40, and 50 operate to determine when the oscillator's output signal OUT is synchronized to low-to-high voltage transitions in the oscillator's input signal IN.

Figure 3:
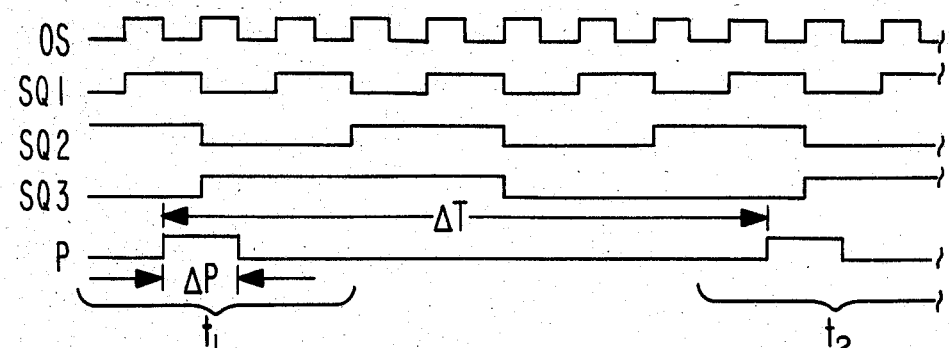
FIG. 3 is a set of waveforms illustrating the operation of circuit 20 in FIG. 2.

Circuit 20 consists of a digital counter 21, a logic gate 22, and a flip-flop 23. Counter 21 has a clock terminal which is coupled to receive the OUT signal, and the counter counts up with each low-to-high voltage transition of the OUT signal. This counting is illustrated in FIG. 3 wherein signals SQ1, SQ2, and SQ3 respectively represent the signals on the counter's output terminals Q1, Q2, and Q3.

Logic gate 22 ANDs the signals SQ1 and SQ2 with the inverse of signal SQ3. That result is then sent to the D input terminal of flip-flop 23 which is clocked by the high-to-low edge of the OUT signal. This, as illustrated in FIG. 3, produces a series of pulses P which are in synchronization with selected oscillations of the OUT signal regardless of the oscillator's frequency. However, only when the oscillator 50 is locked onto the IN signal are the pulses P also in synchronization with the IN signal.

All of the pulses P along with the IN signal are sent to the detector circuit 30. It operates to detect whether any low-to-high transition in the IN signal occurs in the absence of a pulse P. In the FIG. 2 embodiment, circuit 30 consists of a single triggerable D-type flip-flop 31. It has a D input terminal which receives the pulses P, and it has a clock input terminal which receives the IN signal. Consequently, if a pulse P is absent (i.e., low) during a low-to-high voltage transition of the IN signal, then the Q output of flip-flop 31 (i.e., signal CLEAR) goes low.

Circuit 40 operates to tally the number of low-to-high voltage transitions in the IN signal that consecutively occur during the pulses P. Then, if a predetermined number of the pulses P occur with no low-to-high input signal transition between them, circuit 40 generates a LOCK signal which indicates that the oscillator and input signal are synchronized.

In the FIG. 2 embodiment, circuit 40 consists of a single digital counter 41. It has an asynchronous reset terminal which is coupled to receive the CLEAR signal from circuit 30, and it has a clock terminal which is coupled to receive signal SQ3. Any of the higher order Q output terminals of the counter (e.g., Q4–Q10) can be selected as generating the LOCK signal; and the closeness to which the frequencies of the IN and OUT signals are matched before LOCK is generated increases as the order of Q increases.

Figure 1:
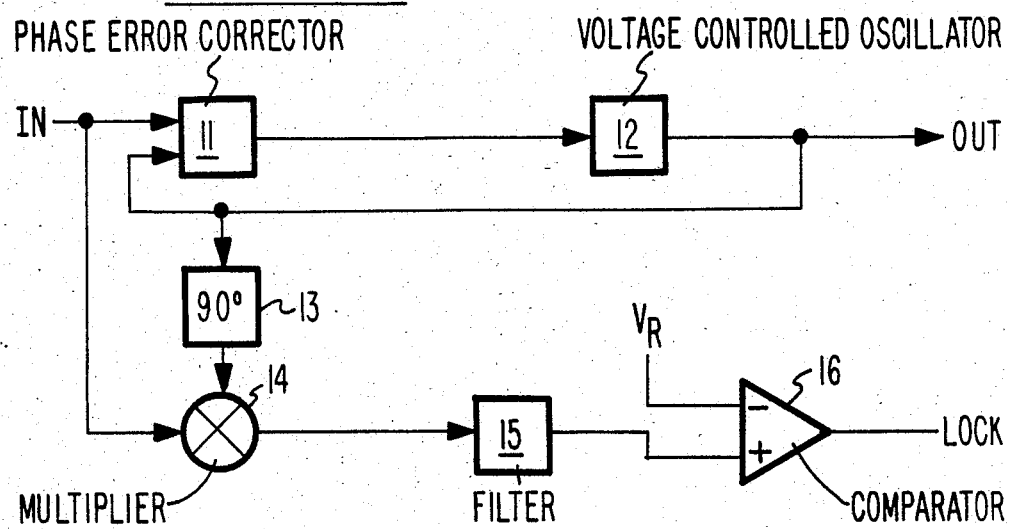
FIG. 1 is a circuit diagram of a prior art voltage controlled oscillator and circuit for detecting when the oscillator is in lock.

Oscillator circuit 50 consists of a phase error correction circuit 51 and a VCO circuit 52. These circuits 51 and 52 are identical to the circuits 11 and 12 which were described in conjunction with FIG. 1. However, in FIG. 2, signal SQ3 rather than signal OUT is fed back to circuit 51.

Figure 4:
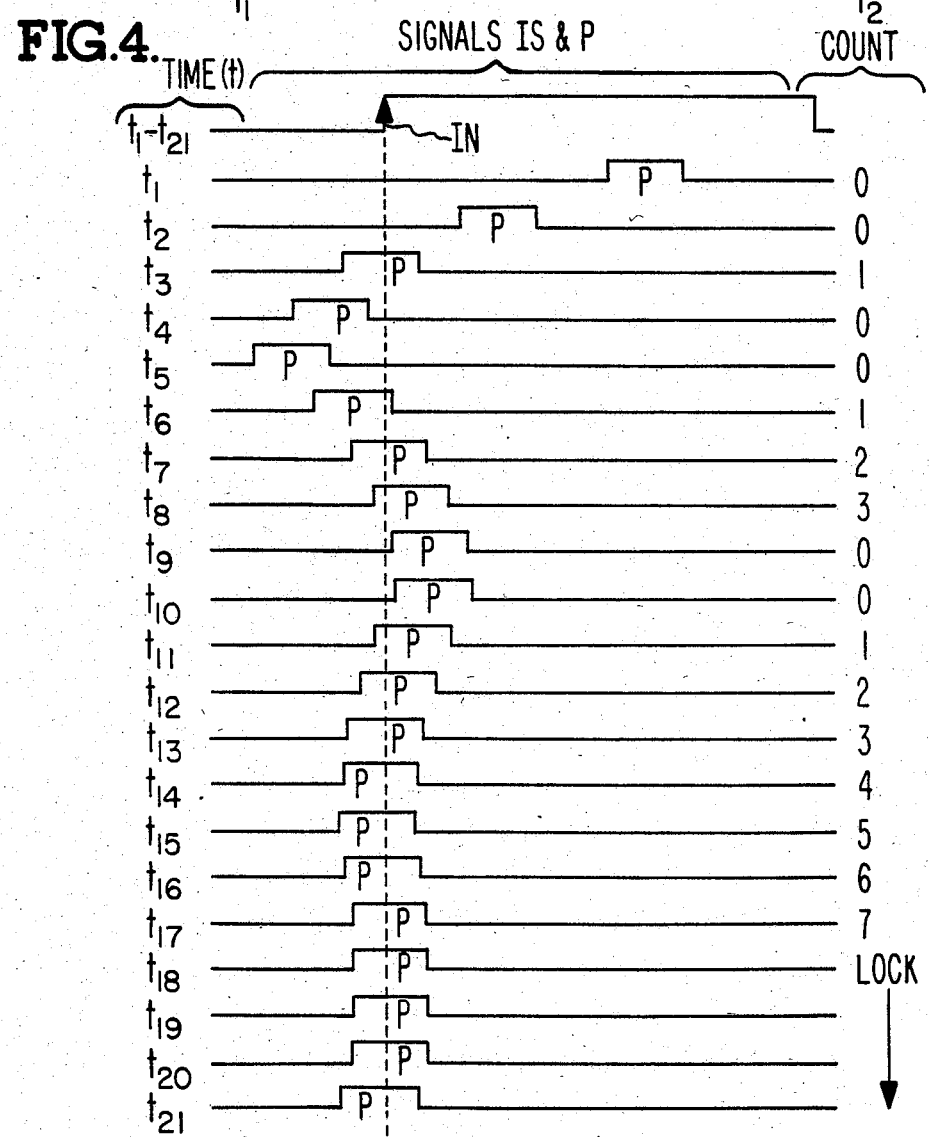
FIG. 4 is a set of waveforms illustrating the operation of circuits 30 and 40 in FIG. 2.

FIG. 4 contains a set of waveforms which further illustrate the operation of the above described circuits. In FIG. 4, the topmost waveform shows the input signal IN, and the remaining waveforms show the position of the pulse signal P relative to the IN signal for twenty-one consecutive pulses. The first pulse occurs at time $t_1$; the second pulse occurs at time $t_2$; etc. Signal SQ3 always occurs in the center of the pulse P.

Initially, the center of the pulse P (i.e., — the rising edge of signal SQ3) relative to the IN signal is random. Consequently, at time $t_1$, a large phase difference is shown between those two signals. When the circuit 51 detects this phase error, it responds by sending a control voltage to the VCO 52 which causes the oscillator's frequency to speed up. As a result, the next pulse P which occurs at time $t_2$ moves to the left and is closer to the voltage transition in the input signal.

But at time $t_2$, a phase difference still exists between the center of the pulse P and the IN signal. Consequently, circuit 51 sends a control voltage to the VCO 52 which causes it to increase in frequency even further. Thus the next pulse at time $t_3$ moves further to the left.

At time $t_3$, little or no error is found by circuit 51 between the IN signal and the center of the pulse P. Thus, the frequency of VCO 52 remains essentially unchanged, and so the next pulse P at time $t_4$ moves ahead of the low-to-high transition in the IN signal. This error in phase is then detected by circuit 51 which sends a voltage to VCO 52 which causes its frequency to decrease. However, the decrease in frequency does not occur instantaneously, and so the pulse at time $t_5$ is even further ahead of the IN signal transition. Thereafter, the pulses at time $t_6$, $t_7$, $t_8$, and $t_9$ shift to the right as the oscillator's frequency decreases.

At time $t_9$, the oscillator's frequency has slowed down too much (i.e., the pulse P has moved too far to the right), and thus circuit 51 sends a control voltage to the oscillator 52 which causes it to speed up. Consequently, at times $t_{10}$ thru $t_{15}$, the pulses P move gradually to the left. After time $t_{15}$, only minor corrections are made by the circuit 51 to the oscillator's frequency, and thus the pulses P continually overlap the low-to-high voltage transition in the input signal.

During each of the low-to-high voltage transitions of the input signal that occur at times $t_1$ thru $t_{21}$, circuit 30 operates to sample the state of the pulse signal P. If the pulse P is absent (i.e., —low), clock 31 generates a low CLEAR signal which in turn resets counter 41. Conversely, if the pulse P is present (i.e., —high), then the CLEAR signal goes high and counter 41 is permitted to count.

In FIG. 4, the right-hand column labeled COUNT shows the state of counter 41 after each of the low-to-high transitions in the IN signal that occur at times $t_1$–$t_{21}$. For example, at times $t_1$ and $t_2$ the count is zero since the IN signal transition does not occur during the pulse P. At time $t_3$ the count reaches one because the IN signal transition and the pulse P overlap; but at the next time $t_4$, the count goes back to zero. Similarly, at times $t_6$–$t_8$ the count reaches three; but at time $t_9$ the count goes back to zero.

Subsequently, during times $t_{11}$–$t_{18}$, a total of eight pulses consecutively overlap the low-to-high voltage transition and the IN signal. Thus, counter 41 reaches a count of eight; and that in turn will make the LOCK signal true assuming LOCK is generated from terminal Q4.

As previously stated, the closeness to which the frequencies of the IN and OUT signals are matched before LOCK is generated increases as the order of $Q_N$ increases. Mathematically, this is expressed as $f_{OUT}/2^K = f_{IN} \pm RF_{IN}$ where $R = \Delta P/N\Delta T$.

In these expressions, $f_{OUT}$ equals the frequency of the OUT signal; $f_{IN}$ equals the frequency of the IN signal; K is the order of the Q output of counter 21 that is fed back to circuit 51; R is the resolution between $f_{OUT}$ and $f_{IN}$; $\Delta P$ is the time duration of one pulse P, N is the count which counter 41 must reach before LOCK is signaled; and $\Delta T$ is the time interval from one pulse P to the next one.

Preferably, N is chosen such that the resolution R is less than 0.5%. In other words, N is chosen such that $N > \Delta P/0.005\Delta T$. For example, in FIG. 4 $\Delta P/\Delta T = \frac{1}{8}$; so if N is made equal to sixty-four, the resolution R would be 0.0019. Thus, LOCK would not be generated until $f_{OUT}/8$ was within 0.19% of $f_{IN}$.

A preferred embodiment of the invention has now been described in detail. In addition, however, many changes and modifications can be made to those details without departing from the nature and spirit of the invention. For example, the IN signal can be coupled to clock counter 41 rather than signal SQ3. Accordingly, it is to be understood that the invention is not limited to the above embodiment but is defined by the appended claims.

What is claimed is:

1. An all digital circuit which operates with an electronic oscillator of the type that receives an input signal and synchronizes its oscillations to transitions in the input signal, comprising:
   a pulse-generating means coupled to said oscillator for digitally forming periodic pulses in synchronization with said oscillations of the oscillator;
   a detecting means coupled to receive said pulses and said input signal for digitally detecting each non-coincidence between said transitions in the input signal and said pulses; and
   a counting means coupled to said detecting means for digitally counting said pulses, for resetting each time said detecting means detects a non-coincidence between a transition in the input signal and a pulse, and for indicating said oscillator is synchronized when the count is past a predetermined number.

2. A circuit according to claim 1 wherein all of the recited means are integrated on a single digital chip.

3. A circuit according to claim 1 wherein said pulse-generating means includes a means for digitally gating said oscillations to form said pulses.

4. A circuit according to claim 1 wherein said detecting means detects said non-coincidence by sampling and holding said pulses with a single digital flip-flop which is clocked by said transitions in said input signal.

5. A circuit according to claim 4 wherein said predetermined number is at least $\Delta P/0.005 \Delta T$ where $\Delta P$ is the time duration of each of said pulses and $\Delta P$ is the time duration of each of said pulses and $\Delta T$ is the time duration between consecutive transitions in said input signal.

6. An all-digital circuit for use with an electronic oscillator of the type that receives an input signal and synchronizes its oscillations to transitions in the input signal, comprising:
 a first means coupled to said oscillator for generating periodic digital pulses in synchronization with said oscillator;
 a second means coupled to said first means for digitally detecting non-coincidence between each transition in the input signal and each pulse by sampling said pulse with said transition and holding the samples from one transition to the next; and
 a third means coupled to said second means for indicating said oscillator is synchronized only when a predetermined number of pulses consecutively occur without said second means detecting a single non-coincidence.

7. A circuit according to claim 1 wherein said first, second, and third means are integrated on a single digital chip.

8. A circuit according to claim 1 wherein said predetermined number is at least $\Delta P/0.005 \Delta T$ where $\Delta P$ is the time duration of each of said pulses and $\Delta T$ is the time duration between consecutive transitions in said input signal.

9. A circuit according to claim 6 wherein said third means consists of a single digital counter which is reset each time said second means detects a non-coincidence between said transitions and said pulses.

* * * * *